(12) United States Patent
Shen et al.

(10) Patent No.: US 8,659,207 B2
(45) Date of Patent: Feb. 25, 2014

(54) ELECTRONIC DEVICE AND ADJUSTMENT METHOD THEREOF

(75) Inventors: Weng-Chang Shen, Taoyuan County (TW); Hsu-Hsiang Tseng, Taoyuan County (TW)

(73) Assignee: HTC Corporation, Taoyuan County (TW)

( * ) Notice: Subject to any disclaimer, the term of this patent is extended or adjusted under 35 U.S.C. 154(b) by 80 days.

(21) Appl. No.: 13/304,406

(22) Filed: Nov. 24, 2011

(65) Prior Publication Data
US 2013/0134832 A1 May 30, 2013

(51) Int. Cl.
*H01L 41/08* (2006.01)
*H03H 9/00* (2006.01)

(52) U.S. Cl.
USPC ..................... 310/316.01; 310/314

(58) Field of Classification Search
USPC ......... 310/314, 316.01, 316.02, 318; 345/173
See application file for complete search history.

(56) References Cited

U.S. PATENT DOCUMENTS

| | | | |
|---|---|---|---|
| 6,429,571 B2 | 8/2002 | Raffalt et al. | |
| 6,975,123 B1 * | 12/2005 | Malang et al. | 324/658 |
| 7,062,825 B2 * | 6/2006 | Takahashi et al. | 29/25.35 |
| 7,728,484 B2 * | 6/2010 | Bachmaier et al. | 310/317 |
| 2004/0246315 A1 * | 12/2004 | Takahashi | 347/71 |
| 2006/0273805 A1 | 12/2006 | Peng et al. | |
| 2007/0103449 A1 | 5/2007 | Laitinen et al. | |
| 2007/0281646 A1 * | 12/2007 | Itaya et al. | 455/197.2 |
| 2010/0264934 A1 | 10/2010 | Inoue et al. | |
| 2011/0029287 A1 | 2/2011 | Sohn et al. | |
| 2011/0169374 A1 * | 7/2011 | Engel et al. | 310/314 |

FOREIGN PATENT DOCUMENTS

| | | |
|---|---|---|
| DE | 2211750 | 9/1973 |
| DE | 2548264 | 5/1977 |
| DE | 3241601 | 2/1984 |
| JP | 2005160028 | 6/2005 |
| TW | 201003496 | 1/2010 |

OTHER PUBLICATIONS

"Office Action of Germany counterpart application" with English translation thereof, issued on Nov. 13, 2012, p. 1-p. 14, in which the listed references were cited.
"Office Action of Taiwan counterpart application", issued on Nov. 15, 2013, p. 1-p. 6, in which the listed reference was cited.

* cited by examiner

*Primary Examiner* — Thomas Dougherty
(74) *Attorney, Agent, or Firm* — Jianq Chyun IP Office

(57) ABSTRACT

An electronic device and an adjustment method thereof are provided. Generate an adjustment voltage according to a preset capacitance and a capacitance detected by a capacitive sensor coupled to both sides of a piezoelectric element, and generate a driving voltage to drive the piezoelectric element according to the adjustment voltage, so as to avoid depolarization of the piezoelectric element affecting the vibration strength of the vibration device.

11 Claims, 2 Drawing Sheets

ELECTRONIC DEVICE AND ADJUSTMENT METHOD THEREOF

BACKGROUND

1. Technical Field

The present disclosure is related to an electronic device and an adjustment method thereof, and more particularly, to an electronic device which the vibration strength is not affected by depolarization of the piezoelectric element and an adjustment method thereof.

2. Background

The demand for human nature and the advancement of technology, functions of the mobile phone have been improved rapidly, but the interaction between technology and humanity remains the point to be emphasized. Regarding this point, the most direct method is that the mobile phone reacts timely while using a function on the screen or playing a game in order to increase the interaction between a user and a mobile phone. One of the direct reactions is the appropriate vibration of the mobile phone. Currently, the method for vibrating a mobile phone employs the Eccentric Rotating Mass (EMR) or the piezoelectric element to achieve the vibrating effect. For faster reaction, the piezoelectric element is a better choice. The driving method of the piezoelectric element is using a driving voltage on both sides of the piezoelectric element to generate an electric field and drive the piezoelectric element for generating vibration. The greater the driving voltage value, the greater the vibrating strength. However, the electric field will cause the piezoelectric element depolarized under long term usage, and the vibration strength decreased.

SUMMARY

The present disclosure provides an electronic device and an adjustment method thereof to avoid depolarization of the piezoelectric element decreasing the vibration strength of the electronic device.

In the present disclosure, an electronic device which includes a piezoelectric element, a capacitive sensor, a control unit and a driving unit is provided, wherein the piezoelectric element generates vibration according to the driving voltage. The capacitive sensor is coupled to both sides of the piezoelectric element in order to detect a capacitance between the two sides of the piezoelectric element. The control unit coupled to the capacitive sensor outputs an adjustment voltage according to the above-mentioned capacitance and a preset capacitance. The driving unit coupled to the control unit and the piezoelectric element outputs a driving voltage according to the adjustment voltage and a preset voltage.

In an embodiment of the disclosure, the control unit calculates the difference between the capacitance and the preset capacitance in order to output the adjustment voltage.

In an embodiment of the disclosure, the above-mentioned capacitive sensor includes a first electrode and a second electrode disposed at respective sides of the piezoelectric element, and the above-mentioned capacitance is generated between the first electrode and the second electrode.

The present disclosure further provides an adjustment method for an electronic device, wherein the electronic device comprises a piezoelectric element for generating vibration and a capacitive sensor disposed and coupled to both sides of the piezoelectric element. The adjustment method for the electronic device comprises following steps: detecting a capacitance between the two sides of the piezoelectric element, outputting the adjustment voltage according to the above-mentioned capacitance and the preset capacitance and outputting the driving voltage according to the adjustment voltage and the preset voltage.

In an embodiment of the disclosure, outputting the adjustment voltage according to the capacitance and the preset capacitance comprises following steps: calculating the difference between the capacitance and the preset capacitance and outputting the adjustment voltage according to the difference.

In an embodiment of the disclosure, the driving voltage is a summation of the adjustment voltage and the preset voltage.

In an embodiment of the disclosure, the piezoelectric element is made of a material comprising quartz, tourmaline, zinc oxide, polymer, ceramic material or compound material.

In an embodiment of the disclosure, the preset capacitance is the capacitance of the piezoelectric element detected without depolarization and the preset voltage is the driving voltage of the piezoelectric element without depolarization.

In view of the above, the present disclosure generates the adjustment voltage according to the preset capacitance and the capacitance detected by the capacitive sensor disposed at the both sides of the piezoelectric element, and further generates the driving voltage for driving the piezoelectric element according to the adjustment voltage in order to avoid depolarization of the piezoelectric material affecting the vibration strength of the piezoelectric element.

In order to make the aforementioned and other features and advantages of the disclosure more comprehensible, embodiments accompanying figures are described in detail below.

BRIEF DESCRIPTION OF THE DRAWINGS

The accompanying drawings constituting a part of this specification are incorporated herein to provide a further understanding of the disclosure. Here, the drawings illustrate embodiments of the disclosure and, together with the description, serve to explain the principles of the disclosure.

DESCRIPTION OF EMBODIMENTS

Figure 1:
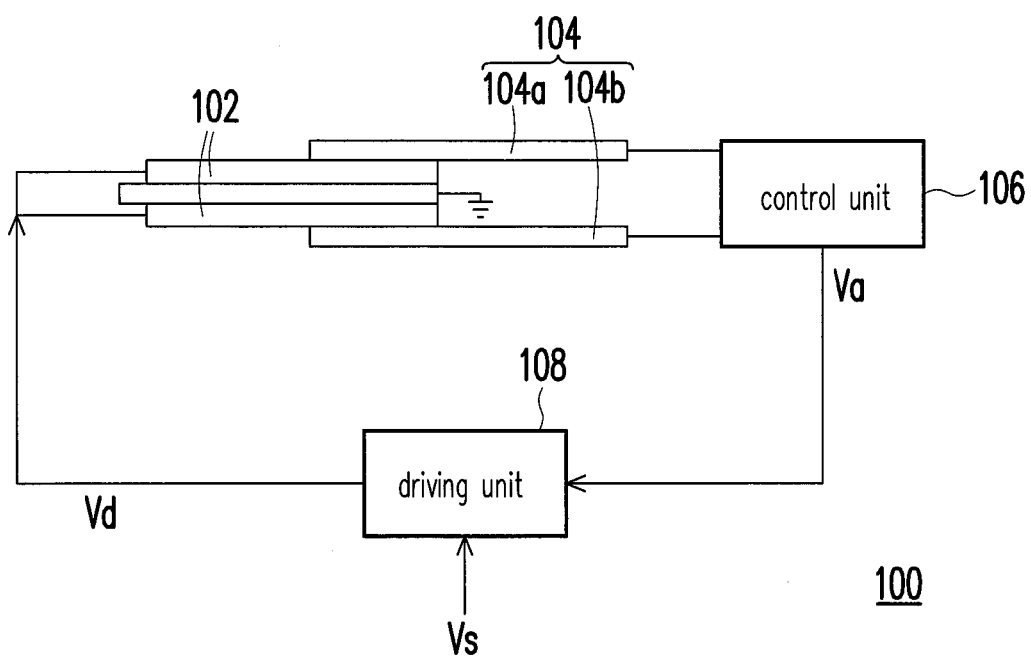
FIG. 1 is a schematic diagram showing an electronic device according to an embodiment of the present disclosure.

FIG. 1 is a schematic diagram showing an electronic device according to an embodiment of the present disclosure. The electronic device 100 includes a piezoelectric element 102, a capacitive sensor 104, a control unit 106 and a driving unit 108. The piezoelectric element has the ability for mutual converting electrical energy and mechanical energy. When the piezoelectric element is driven by the voltage, the piezoelectric element generates a mechanical stress and becomes deformed so as to generate the vibration. The piezoelectric element could be made of the piezoelectric material comprising quartz, tourmaline, zinc oxide, polymer, ceramic material or compound material.

In the present embodiment, the capacitive sensor 104 coupled to both sides of the piezoelectric element 102 in order to detect a capacitance between the two sides of the piezoelectric element 102. In more detail, the capacitive sensor 104 includes a first electrode 104a and a second electrode 104b, wherein the first electrode 104a and the second electrode 104b are disposed at respective sides of the piezoelectric element 102, and the above-mentioned capacitance is generated between the first electrode 104a and the second electrode 104b.

A control unit 106 coupled to the capacitive sensor 104 and the driving unit 108 produces an adjustment voltage Va according to the capacitance detected by the capacitive sensor 104 and a preset capacitance. Herein, the preset capacitance is the capacitance detected by the capacitive sensor 104 before the depolarization occurred on the piezoelectric element 102 and the voltage value of the adjustment voltage Va may be calculated from the experience. Furthermore, the driving unit 108, coupled to the piezoelectric element 102, outputs a driving voltage Vd to the piezoelectric element 102 according to the adjustment voltage Va and a preset voltage Vs so as to drive the piezoelectric element 102 for generating vibration effect. The preset voltage Vs is the voltage for driving the piezoelectric element 102 without the depolarization occurred on the piezoelectric element.

Accordingly, when the piezoelectric element 102 is not depolarized, the capacitance detected by the capacitive sensor 104 is the preset capacitance, and the adjustment voltage Va outputted from the control unit 106 is not required (or the adjustment voltage value is zero). The driving unit 108 uses the preset voltage Vs as the driving voltage Vd, and applies the driving voltage Vd to the piezoelectric element 102 to drive the piezoelectric element 102 for generating vibration.

When depolarization occurred on the piezoelectric element 102 after a time period, the capacitance detected by the capacitive sensor 104 begins to decrease because of the effect of depolarization. Therefore, the control unit 106 outputs the adjustment voltage Va according to the change of the capacitance. For example, the control unit 106 may calculate the difference between the capacitance detected by the capacitive sensor 104 and the preset capacitance and output the adjustment voltage Va according to the difference. As the difference between the capacitance and the preset capacitance is increased, the adjustment voltage Va outputted by the control unit 106 is increased.

On the other hand, the driving unit 108 outputs the driving voltage Vd according to the adjustment voltage Va and the preset voltage Vs. For example, the driving unit 108, such as an adder, may add the adjustment voltage Va to the preset voltage Vs, and the result is outputted to the piezoelectric element 102 as the driving voltage Vd to drive the piezoelectric element 102 for generating vibration. By responding to the depolarization of the piezoelectric element 102, the control unit 106 and the driving unit 108 adjust the driving voltage Vd applied to the piezoelectric element 102 so as to adjust the vibration strength of the piezoelectric element 102. If the piezoelectric element is depolarized more seriously, the adjustment voltage Vs is increased in order to avoid the vibration strength of the electronic device 100 decreased because of the piezoelectric element depolarized.

It should be noted that, in other embodiments, the method for the control unit 106 to decide the adjustment voltage Va is not limited to the difference between the capacitance and the preset capacitance. The method for the driving unit 108 to decide the value of the driving voltage Vd is also not limited to the summation of the adjustment voltage Va and the preset voltage Vs. The variation of the adjustment voltage Va and the driving voltage Vd is not only limited to the above-mentioned method, but also depends on some complicated formulas.

Figure 2:
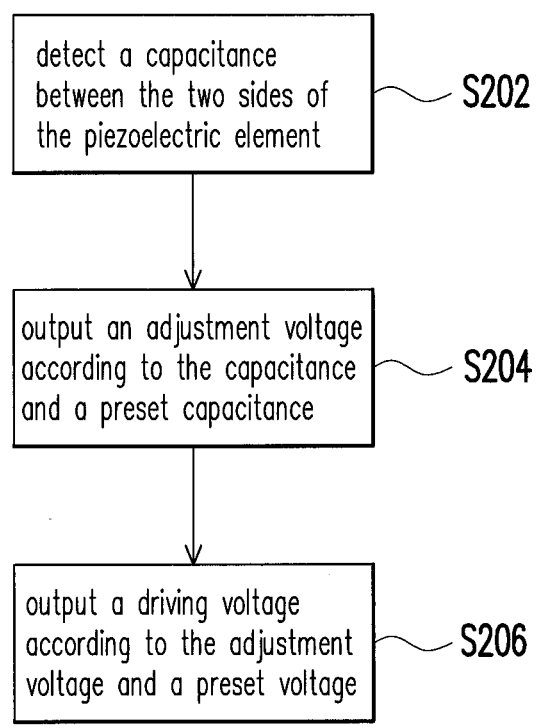
FIG. 2 is a flow chart showing an adjustment method of an electronic device according to an embodiment of the present disclosure.

FIG. 2 is a flow chart showing an adjustment method of an electronic device according to an embodiment of the present disclosure. Referring to the FIG. 2, as described in the above embodiment, the adjustment method of an electronic device comprises following steps. First, detect a capacitance between the two sides of the piezoelectric element (Step S202). Next, output the adjustment voltage according to the capacitance and the preset capacitance (Step S204), wherein the preset capacitance is the capacitance detected before the depolarization occurred on the piezoelectric element. For instance, calculate the difference between the capacitance and the preset capacitance, and output the adjustment voltage according to the difference. The greater the difference, the greater the adjustment voltage outputted. At last, output the driving voltage according to the adjustment voltage and the preset voltage (Step S206), so as to drive the piezoelectric element for generating vibration. The preset voltage is the voltage for driving the piezoelectric element without the depolarization occurred on the piezoelectric element and the voltage value of the driving voltage is, for example, the summation of the adjustment voltage and the preset voltage.

In summary, the present disclosure uses the control unit to generate the adjustment voltage according to the difference between the capacitance detected by the capacitive sensor and the preset capacitance, and uses the driving unit to generate the driving voltage according to the adjustment voltage. The value of the driving voltage responds to the degree of the depolarization of the piezoelectric in order to maintain the vibration strength of the electronic device and to solve the decrease of the vibration strength due to the depolarization of the piezoelectric element.

Although the disclosure has been described with reference to the above embodiments, it will be apparent to one of ordinary skill in the art that modifications to the described embodiment may be made without departing from the spirit of the disclosure. Accordingly, the scope of the disclosure will be defined by the attached claims not by the above detailed descriptions.

What is claimed is:
1. An electronic device, comprising:
a piezoelectric element, for generating vibration according to a driving voltage, the driving voltage being applied on both sides of the piezoelectric element for driving the piezoelectric element;
a capacitive sensor, having a first electrode coupled to one side of the piezoelectric element and a second electrode coupled to the other side of the piezoelectric element for detecting a capacitance between the two sides of the piezoelectric element;
a control unit, coupled to the capacitive sensor for outputting an adjustment voltage according to a preset capacitance and the capacitance; and
a driving unit, coupled to the control unit and the piezoelectric element for outputting the driving voltage according to the adjustment voltage and a preset voltage.

2. The electronic device according to claim 1, wherein the control unit calculates a difference between the capacitance and the preset capacitance so as to output the adjustment voltage.

3. The electronic device according to claim 1, wherein the driving voltage is a summation of the adjustment voltage and the preset voltage.

4. The electronic device according to claim 1, wherein the piezoelectric element is made of a material comprising quartz, tourmaline, zinc oxide, polymer, ceramic material or compound material.

5. The electronic device according to claim 4, wherein the preset capacitance is a capacitance of the piezoelectric element detected without depolarization and the preset voltage is the driving voltage of the piezoelectric element without depolarization.

6. The electronic device according to claim 1, wherein the capacitive sensor comprises:
a first electrode; and a second electrode, wherein the first electrode and the second electrode are disposed at respective sides of the piezoelectric element.

7. An adjustment method for an electronic device, wherein the electronic device comprises a piezoelectric element for generating vibration according to a driving voltage applied on both sides of the piezoelectric element for driving the piezoelectric element and a capacitive sensor having a first electrode coupled to one side of the piezoelectric element and a second electrode coupled to the other side of the piezoelectric element, comprises following steps:

detecting a capacitance between the two sides of the piezoelectric element;

outputting an adjustment voltage according to the capacitance and a preset capacitance; and outputting a driving voltage according to the adjustment voltage and a preset voltage.

8. The adjustment method for the electronic device according to claim 7, wherein the steps of outputting the adjustment voltage according to the capacitance and the preset capacitance comprises:

calculating a difference between the capacitance and the preset capacitance; and outputting the adjustment voltage according to the difference.

9. The adjustment method for the electronic device according to claim 7, wherein the driving voltage is a summation of the adjustment voltage and the preset voltage.

10. The adjustment method for the electronic device according to claim 7, wherein the piezoelectric element is made of a material comprising quartz, tourmaline, zinc oxide, polymer, ceramic material or compound material.

11. The adjustment method for the electronic device according to claim 10, wherein the preset capacitance is the capacitance of the piezoelectric element detected without depolarization and the preset voltage is the driving voltage of the piezoelectric element without depolarization.

* * * * *